United States Patent
Chang

(10) Patent No.: US 7,382,173 B1
(45) Date of Patent: Jun. 3, 2008

(54) LEVEL SHIFT CIRCUIT WITH VOLTAGE PULLING

(75) Inventor: Yu Jui Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 64 days.

(21) Appl. No.: 11/566,654

(22) Filed: Dec. 4, 2006

(51) Int. Cl.
*H03L 5/00* (2006.01)

(52) U.S. Cl. .................. 327/333; 326/62; 326/80

(58) Field of Classification Search ................ 327/333; 326/62, 80
See application file for complete search history.

(56) References Cited

U.S. PATENT DOCUMENTS

2001/0017608 A1* 8/2001 Kogure et al. ................ 345/87
2005/0195011 A1* 9/2005 Tseng et al. .................. 327/333

* cited by examiner

*Primary Examiner*—Marvin Lateef
*Assistant Examiner*—Adam Houston
(74) *Attorney, Agent, or Firm*—WPAT, P.C.; Anthony King

(57) ABSTRACT

A level shift circuit with voltage pulling includes a voltage-pulling circuit and at least one inverter. The voltage-pulling circuit contains a capacitance element, a first switch receiving a first voltage and charging the capacitance element according to a first control signal, a second switch discharging the capacitance element and being able to generate a first input signal according to a second control signal, and a third switch receiving a second voltage and being able to generate the first input signal according to the first control signal. The at least one inverter conditions the first input signal and is coupled to the voltage-pulling circuit.

15 Claims, 2 Drawing Sheets

LEVEL SHIFT CIRCUIT WITH VOLTAGE PULLING

BACKGROUND OF THE INVENTION

1. Field of the Invention

The present invention relates to a level shift circuit, and more particularly, to a level shift circuit with voltage pulling.

2. Description of the Related Art

FIG. 1 shows a conventional level shift circuit 1, used in a scan driver of an LCD (Liquid Crystal Display) module, to convert a low-voltage digital signal into a high-voltage digital signal. The level shift circuit 1 includes four HV (high voltage) MOS transistors T1-T4 coupled to each other. The sources of two HV PMOS transistors T1 and T2 receive a first voltage VDDA (e.g., 9 volts or 14 volts). The sources and bulks of two HV NMOS transistors T3 and T4 are connected to a ground level VSSA. When an input signal IN with a low-voltage high state (e.g., 3.3 volts) is applied at the gate of the HV NMOS transistor T3, the HV PMOS transistor T2 is turned on by the gate thereof being grounded through the conductive HV NMOS transistor T3. The HV NMOS transistor T4 is turned off by an inverse signal INB (an inverse signal of the input signal IN) with a low-voltage low state (i.e., 0 volts) applied at the gate thereof. Therefore, an output signal DDX exhibits a high-voltage high state of the first voltage VDDA. In the meantime, the HV PMOS transistor T1 is turned off with the gate thereof at the first voltage VDDA. That is, a low-voltage high state (e.g., 3.3 volts) is converted into a high-voltage high state (e.g., 9 volts or 14 volts) by the level shift circuit 1. When the input signal IN switches to the low-voltage low state (i.e., 0 volts) and the inverse signal INB switches to the low-voltage high state (e.g., 3.3 volts), the HV NMOS transistor T3 is turned off and the HV NMOS transistor T4 is turned on. The HV PMOS transistor T1 is turned on by the gate thereof being grounded through the conductive HV NMOS transistor T4, and the HV PMOS transistor T2 is turned off by the gate thereof receiving the first voltage VDDA through the conductive HV NMOP transistor T1. Therefore, the output signal DDX exhibits a high-voltage low state (i.e., 0 volts). That is, a low-voltage low state (i.e., 0 volts) is converted into a high-voltage low state (i.e., 0 volts) by the level shift circuit 1.

When the inverse signal INB switches from the low-voltage low state to the low-voltage high state (i.e., switches from 0 volts to around 1.6 volts) in some low-voltage applications, the HV NMOS transistor T4 that has a threshold voltage of around 1.4 volts is not easily turned on. This results in some issues. First, the time in which the output signal DDX switches from the high state to the low state is increased. Second, it is possible to generate a DC current path at a moment when all four HV transistors T1-T4 are turned on. Third, a large current dissipates due to the first two issues. Fourth, switching states fails due to the DC current latch. One conventional solution proposed is to add a charge pump to boost the voltage level of the input signal IN and the inverse signal INB from 1.6 volts to 3.2 volts, for example. However, the nature of the low-voltage application causes the accumulated charge by the charge pump to be limited. Consequently, a large capacitor (equivalent to a large area) is needed for this solution.

SUMMARY OF THE INVENTION

One aspect of the present invention is to provide a level shift circuit with voltage pulling, by increasing the voltage level at the input stage of the level shift circuit, to enhance the capability of switching states in a low-voltage application such as a source river of an LCD panel.

Another aspect of the present invention is to provide a voltage-pulling circuit, by charging a capacitor to generate a pulled-up input signal to a level shift circuit unit.

The present invention discloses a level shift circuit with voltage pulling. The level shift circuit with voltage pulling includes a voltage-pulling circuit and at least one inverter. The voltage-pulling circuit outputs a first input signal and includes a capacitance element, a first switch receiving a first voltage and charging the capacitance element according to a first control signal, a second switch discharging the capacitance element and being capable of generating the first input signal according to a second control signal, and a third switch receiving a second voltage and being capable of generating the first input signal according to the first control signal. The at least one inverter conditions the first input signal and is coupled to the voltage-pulling circuit.

BRIEF DESCRIPTION OF THE DRAWINGS

The invention will be described according to the appended drawings in which.

DETAILED DESCRIPTION OF THE INVENTION

Figure 2:
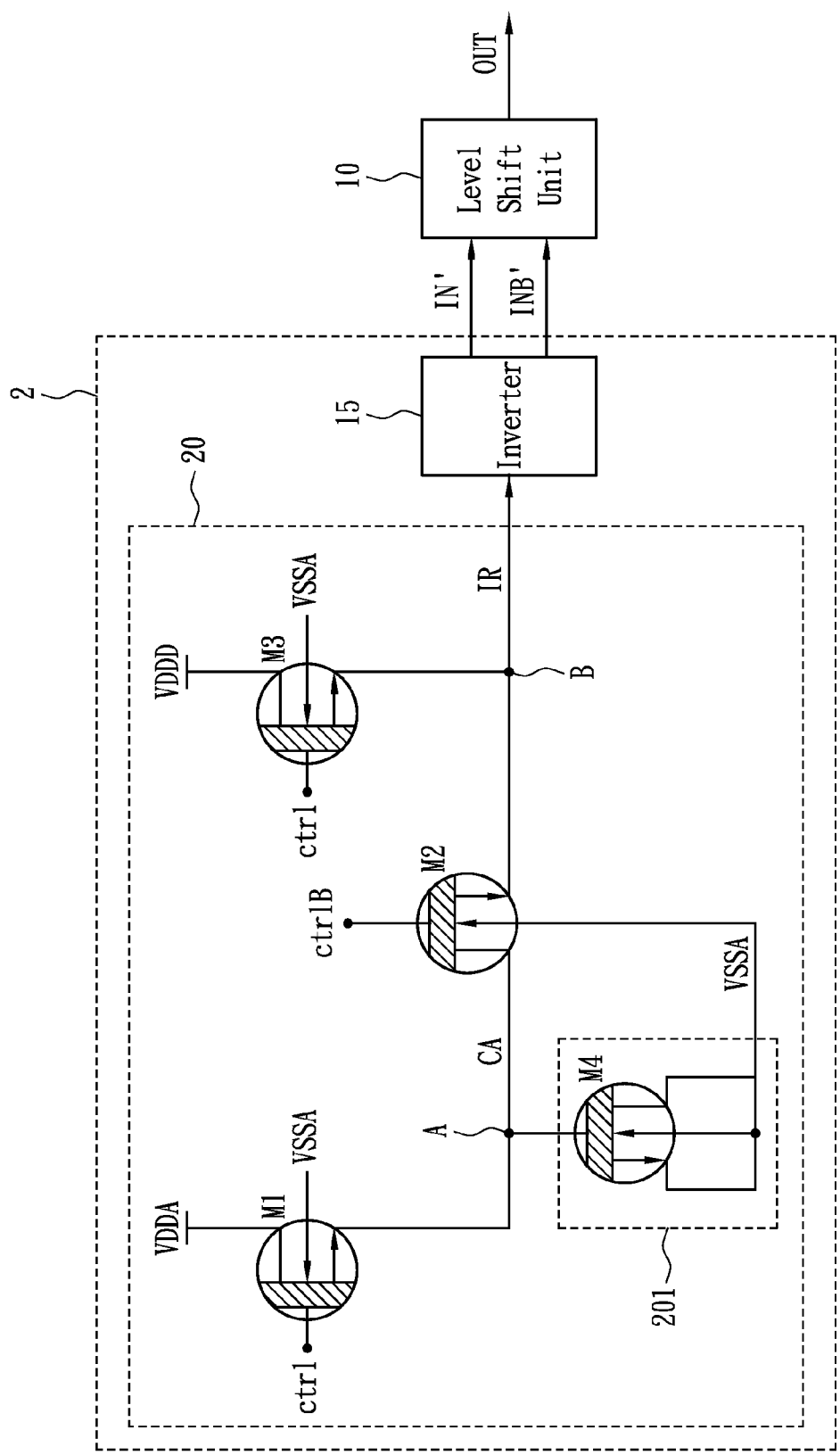
FIG. 2 shows an embodiment of a level shift circuit with voltage pulling according to the present invention.

FIG. 2 shows a first embodiment of a level shift circuit 2 with voltage pulling according to the present invention. The level shift circuit 2 with voltage pulling includes a voltage-pulling circuit 20 and an inverter 15. The voltage-pulling circuit 20 includes a capacitance element 201, a first switch M1, a second switch M2, and a third switch M3. In the current embodiment, the three switches M1-M3 and the capacitance element 201 are HV NMOS transistors whose bulks are connected to a ground level VSSA. The HV NMOS transistor M1 is coupled to the capacitance element 201 through the source thereof, receives the first voltage VDDA (e.g., 9 or 14 volts) through the drain thereof, and receives a first control signal ctrl at the gate thereof. The HV NMOS transistor M2 is coupled to the capacitance element 201 through the drain thereof and receives a second control signal ctrlB at the gate thereof. The HV NMOS transistor M3 is coupled to the HV NMOS transistor M2 through the source thereof, receives the first control signal ctrl at the gate thereof, and receives a second voltage VDDD (e.g., 3.6 volts) at the drain thereof. The capacitance element 201 is implemented by connecting the bulk, the source, and the drain of the HV NMOS M4 to the ground level VSSA.

The operation of the level shift circuit 2 with voltage pulling of FIG. 2 is given as follows. Note that the first control signal ctrl and the second control signal ctrlB are complementary to each other. When the first control signal ctrl is in the high logic state, and therefore, the second control signal ctrlB is in the low logic state, the HV NMOS transistor M1 receives the first voltage VDDA and charges the capacitance element 201 to a specific voltage level CA that is dependent on the voltage level of the first control signal ctrl. That is, the specific voltage level CA is equal to the voltage level of the first control signal ctrl minus the threshold voltage of the HV NMOS transistor M1. In the meantime, the HV NMOS transistor M3 is turned on by the first control signal ctrl and generates the first input signal IR of the second voltage VDDD. That is, the HV NMOS transistor M3 generates the first input signal IR when the HV NMOS transistor M1 charges the capacitance element 201. When the first control signal ctrl switches to the low logic state (i.e., the second control signal ctrlB switches to the high logic state), the HV NMOS transistors M1 and M3 are turned off and the HV NMOS transistor M2 discharges the capacitance element 201 to generate the first input signal IR of the specific voltage level CA. The inverter 15 is coupled to the voltage-pulling circuit 20 and converts the first input signal IR into a second input signal IN' and a second input inverse signal INB'.

Figure 1:
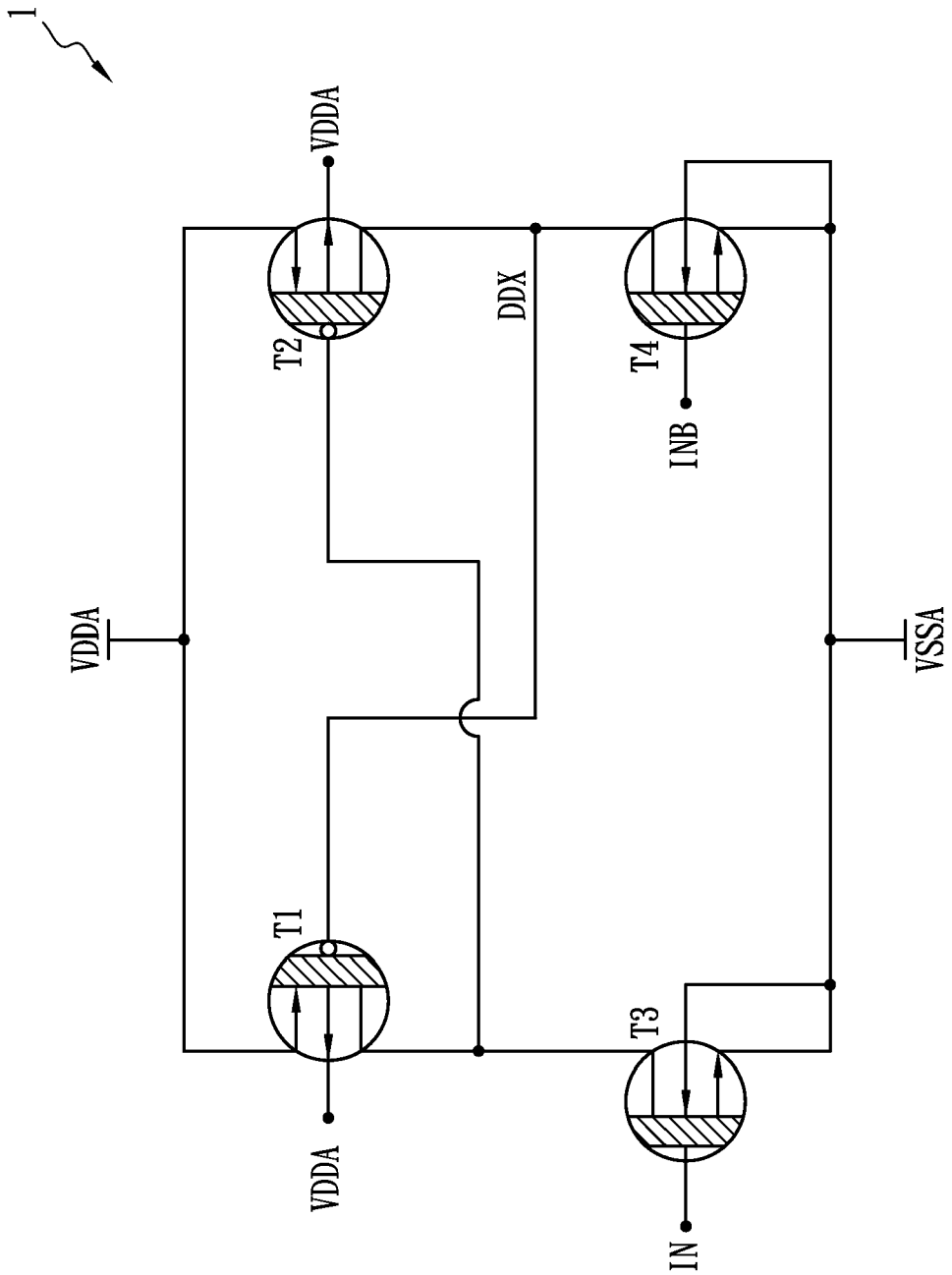
FIG. 1 shows a conventional level shift circuit.

In a second embodiment of the present invention, the level shift circuit 2 with voltage pulling further includes a level shift unit 10 (refer to FIG. 2) whose structure is similar to that of the level shift circuit 1 of FIG. 1. The level shift unit 10 converts the second input signal IN' into an output signal OUT. The voltage level of the output signal OUT is higher than that of the second input signal IN' when the second input signal IN' is in the high logic state. Referring to FIGS. 1 and 2, the second input signal IN' and the second input inverse signal INB' are connected to the input signal IN and the inverse signal INB, respectively. The level shift circuit 2 with voltage pulling may further include plural inverters 15 and plural corresponding level shift units 10.

For the above embodiments, when the level shift circuit 2 with voltage pulling of the present invention is used in a source driver of an LCD panel, the first voltage VDDA would be used as a high logic state for analog signals and the second voltage VDDD would be used as a high logic state for digital signals.

According to the above embodiments, the voltage level at the input stage of the level unit is increased, and thus, the voltage difference between the gate and the source of the HV NMOS transistor T4 (refer to FIG. 1) is increased. Consequently, the capability of switching states of the level shift circuit with voltage pulling in a low-voltage application is enhanced and the expected performance can be achieved by the present invention.

The above-described embodiments of the present invention are intended to be illustrative only. Numerous alternative embodiments may be devised by those skilled in the art without departing from the scope of the following claims.

What is claimed is:

1. A level shift circuit with voltage pulling, comprising:
   a voltage-pulling circuit outputting a first input signal, comprising:
      a capacitance element;
      a first switch receiving a first voltage and charging the capacitance element according to a first control signal;
      a second switch discharging the capacitance element and being capable of generating the first input signal according to a second control signal; and
      a third switch receiving a second voltage and generating the first input signal according to the first control signal; and
   at least one inverter conditioning the first input signal and being coupled to the voltage-pulling circuit.

2. The level shift circuit with voltage pulling of claim 1, further comprising at least one level shift unit coupled to the at least one inverter.

3. The level shift circuit with voltage pulling of claim 1, wherein the capacitance element is a NMOS transistor with the bulk, the source, and the drain thereof connected to a ground level.

4. The level shift circuit with voltage pulling of claim 1, wherein the first, the second and the third switches are transistors whose bulks are connected to a ground level.

5. The level shift circuit with voltage pulling of claim 1, wherein the first switch is a transistor coupled to the capacitance element through the source thereof, receives the first voltage through the drain thereof, and receives the first control signal at the gate thereof.

6. The level shift circuit with voltage pulling of claim 1, wherein the second switch is a transistor coupled to the capacitance element through the drain thereof, and receiving the second control signal at the gate thereof.

7. The level shift circuit with voltage pulling of claim 1, wherein the third switch is a transistor coupled to the second switch through the source thereof, receiving the first control signal at the gate thereof, and receiving the second voltage at the drain thereof.

8. The level shift circuit with voltage pulling of claim 2, wherein the at least one inverter converts the first input signal into a second input signal and a second input inverse signal.

9. The level shift circuit with voltage pulling of claim 8, wherein the level shift unit converts the second input signal into an output signal.

10. The level shift circuit with voltage pulling of claim 9, wherein the level of the output signal is higher than that of the second input signal when the second input signal is in a high logic state.

11. The level shift circuit with voltage pulling of claim 1, wherein the first control signal and the second control signal are complementary to each other.

12. The level shift circuit with voltage pulling of claim 1, wherein the third switch generates the first input signal when the first switch is turned on to charge the capacitance element.

13. The level shift circuit with voltage pulling of claim 1, which is used in a source driver of an LCD panel.

14. The level shift circuit with voltage pulling of claim 1, wherein the first voltage is used as a high logic state for analog signals and the second voltage is used as a high logic state for digital signals.

15. A voltage-pulling circuit for generating a pulled-up input signal of a level shift circuit, wherein an original input signal is received at a first node and the pulled-up input signal is generated at a second node, the voltage-pulling circuit comprising:
   a capacitor having one end coupled to the first node and the other end receiving a first voltage;
   a first switch having one end receiving a second voltage and the other end coupled to the first node, and controlled by a first control signal;
   a second switch coupled between the first and second nodes, and controlled by a second control signal; and
   a third switch having one end receiving a third voltage and the other end coupled to the second node, and controlled by the first control signal;
   wherein the first and second control signals are complementary to each other.

* * * * *